(12) United States Patent
Hu et al.

(10) Patent No.: US 9,979,423 B2
(45) Date of Patent: May 22, 2018

(54) PARALLEL CONNECTION METHOD AND DEVICE FOR MULTI-CHANNEL PD SIGNALS

(71) Applicant: SHANGHAI JIAO TONG UNIVERSITY, Shanghai (CN)

(72) Inventors: Yue Hu, Shanghai (CN); Xiuchen Jiang, Shanghai (CN); Gehao Sheng, Shanghai (CN); Lingyu Cao, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 0 days. days.

(21) Appl. No.: 14/654,571

(22) PCT Filed: Dec. 14, 2014

(86) PCT No.: PCT/CN2014/093788
§ 371 (c)(1),
(2) Date: Jun. 22, 2015

(87) PCT Pub. No.: WO2015/085955
PCT Pub. Date: Jun. 18, 2015

(65) Prior Publication Data
US 2015/0349818 A1    Dec. 3, 2015

(30) Foreign Application Priority Data

Dec. 13, 2013    (CN) .......................... 2013 1 0686843

(51) Int. Cl.
*H04B 1/04*     (2006.01)
*G01R 31/14*    (2006.01)
*G01R 31/12*    (2006.01)

(52) U.S. Cl.
CPC ....... *H04B 1/0483* (2013.01); *G01R 31/1209* (2013.01); *G01R 31/14* (2013.01); *H04B 1/0475* (2013.01)

(58) Field of Classification Search
CPC .................................................... H04B 1/0475
(Continued)

(56) References Cited

U.S. PATENT DOCUMENTS

| 2003/0128100 A1* | 7/2003 | Burkhardt | ............ G06K 7/0008 |
| | | | 340/5.8 |
| 2008/0103712 A1* | 5/2008 | Kim | ....................... H01H 33/26 |
| | | | 702/67 |

(Continued)

OTHER PUBLICATIONS

Alistair Reid, et al. UHF Monitoring of Partial Discharge in Substation Equipment Using a Novel Multi-Sensor Cable Loop. 20th International Conference on Electricity Distribution, Prague, Jun. 8-11, 2009, Paper 0820.

(Continued)

*Primary Examiner* — Kevin M Burd

(57) ABSTRACT

A parallel connection method and a device for multi-channel partial discharge (PD) signals have input sources of pre-processed and amplified signals received by multiple PD sensors. Then isolation and processing are provided to the signals to ensure that each signal is able to be self-triggered and unidirectional transmitted. Finally, processed signals of each channel are outputted. For ultra-high frequency (UHF) PD signal, the delay transmission is realized by a surface acoustic wave (SAW) delay line method. The present invention makes the amplified multi-channel PD signals self-trigger and unidirectional transmit though isolation processing and then realizes parallel connection without interference. The method also decreases signal transmission loss. Meanwhile, all the detected PD signals transmit on one signal bus through parallel connection method, so as to use (Continued)

only one set of acquisition unit to monitor and acquire the signals received by multiple sensors, which obviously lowers the system cost.

7 Claims, 3 Drawing Sheets

(58) Field of Classification Search
USPC .................................................. 375/295, 296
See application file for complete search history.

(56) References Cited

U.S. PATENT DOCUMENTS

2009/0072964 A1* 3/2009 Muralidharan ........ G08B 31/00
340/539.3
2010/0079148 A1* 4/2010 Park ................... G01R 31/1254
324/536

OTHER PUBLICATIONS

Gao Penglu, et al. Partial Discharge Monitoring and Locating in Substation Using Multiple Sensors in Parallel. Transactions of China Electrotechnical Society, vol. 29, No. 2, Feb. 2014, pp. 226-230.

* cited by examiner

PARALLEL CONNECTION METHOD AND DEVICE FOR MULTI-CHANNEL PD SIGNALS

CROSS REFERENCE OF RELATED APPLICATION

This is a U.S. National Stage under 35 U.S.C 371 of the International Application PCT/CN2014/093788, filed Dec. 14, 2014, which claims priority under 35 U.S.C. 119(a-d) to CN201310686843.7, filed Dec. 13, 2013.

BACKGROUND OF THE PRESENT INVENTION

Field of Invention

The present invention relates to signal conditioning, processing, analysis, and control. In particular, the present invention relates to a parallel connection method and a device for multi-channel PD (partial discharge) signals.

Description of Related Arts

In PD signal detection filed, the parallel connection for multi-channel UHF pulse waves to transmit them in one signal bus needs to implement each channel signal can be input into the signal bus without attenuation and prevent it from transmitting to the other channel at the same time.

The following plan A and plan B is generally applied to realize signal isolation and self-triggering switch in state of the art.

Plan A: Circulator. As FIG. 1 shows, signal can only transmit from interface 1 to interface 2, from interface 2 to interface 3, from interface 3 to interface 4, from interface 4 to interface 1. So signal can be unidirectional transmitted in circulator.

Disadvantage of plan A: Circulator absorbs signal energy to isolate reverse signal. So it will cause signal attenuation by 50%.

Plan B: Switching Circuit. When switching circuit is on, it lets the signal go through, conversely isolate the signal.

Disadvantage of plan B: The general switch circuit is not self-triggering.

SUMMARY OF THE PRESENT INVENTION

Aiming at solving the limitation of the prior art, the present invention describes a parallel connection method and a device for multi-channel partial discharge signals. The present invention implements self-triggering one-way transmission and isolation, achieving interference-free parallel connection of multi-channel partial discharge signals (including UHF (ultra-high frequency) PD (partial discharge) signals, ultrasonic signals, high frequency current signals), to avoid the loss of signal in the process of transmission.

The present invention provides a parallel connection method for multi-channel PD signals comprises steps of:

Step 1.1: receiving input sensing signals from sensors, wherein the signals include PD UHF signals, ultrasonic signals, and high frequency current signals;

Step 1.2: pre-processing each of the sensing signals, including amplification and filtering;

Step 1.3: isolating the amplified and filtered signals by a self-triggering switch, for self-triggering one-way transmission of the amplified and filtered signals; and Step 1.4: outputting each signals after isolation treatments;

wherein isolation process of the amplified and filtered signals includes steps of:

Step 1.3.1: dividing the amplified and filtered signals into two parts, namely a first sub signal and a second signal;

Step 1.3.2A: if the first sub signal is the UHF PD signal, setting a delay time for first sub signal transmission, dividing the first sub signal into several frequency band groups, combining the delayed signals by a synthesizer and amplifying, and outputting the signal by the self-triggering switch, or demodulating the output signal;

if the first sub signal is the high frequency current signal or the ultrasonic signal, setting the delay time or outputting the signal directly by the self triggering switch without delay;

Step 1.3.2B: comparing the second sub-signal with a reference level for signal auto-detection, transferring the second sub-signal into a driving signal for switch; and Step 1.3.3: widening the signal to match a set time width for driving the self-triggering switch.

Preferably, transmission delay of the UHF PD signal is realized by SAW (surface acoustic wave), transmission delay of the high frequency current signal and the ultrasonic signal is realized by an emitter-follower circuit.

Preferably, frequency bands of UHF PD signal delay transmission comprise 400 MHz-500 MHz, 700 MHz-800 MHz, and 1100 MHz-1200 MHz.

Preferably, the reference level is adjustable.

Preferably, the driving signal for switch is a square wave signal with a constant voltage and a matching pulse width to a received sensing signal.

The present invention of the parallel connection method for multi-channel PD signals comprises following devices:

a signal input connector, which receives input signals from multiple sensors, wherein the input signals include UHF PD signals, ultrasonic signals and high frequency current signals;

a signal amplification circuit, which pre-processes each of the input signals, including amplification and filtering;

a signal isolation circuit, which isolates and processes the amplified and filtered signal, for ensuring self-triggering and unidirectional transmitting; and a signal output connector, which outputs the isolated signal.

The signal isolation circuit comprises:

a signal separation circuit, which divides the amplified and filtered signal into two sub-signals, a first sub signal and a second signal;

a time-delay circuit for the UHF PD signal, wherein if the first sub signal is the UHF PD signal, a delay time is set for the first sub signal transmission;

if the first sub signal is the high frequency current signal or the ultrasonic signal, a delay time is set or the signal is directly outputted by a self triggering switch without delay;

a signal combination circuit, which combines and amplifies the multiple divided first sub signal to output by the self-triggering switch;

a reference level circuit, which offers a reference level;

a fast-comparison circuit, which compares the second sub-signal with the reference level for signal auto-detection, and transfers the second sub-signal into a driving signal for switch; and a mono-stable trigger circuit, which widens the signal to match the set time width for driving the self-triggering switch.

Preferably, the transmission delay of the UHF PD signal is realized by SAW.

Preferably, frequency bands of UHF PD signal delay transmission comprise 400 MHz-500 MHz, 700 MHz-800 MHz, and 1100 MHz-1200 MHz.

Preferably, the reference level is adjustable reference level.

Preferably, the driving signal for switch is a square wave signal with a constant voltage and a matching pulse width to a receiving sensing signal.

Compared with the prior art, the present invention has the following advantages:

The present invention amplifies the input signals from multiple sensors, and then detects the UHF signal therein. The amplified signal is isolated to self triggering one-way transmit. Finally all the processed signals are output completely. The present invention ensures the self-triggering one-way transmission ans isolation based on multi-channel signal amplification and isolation process. And then multi-channel UHF PD signal is parallel connected without interference, avoiding further loss during transmission.

Meanwhile, in the present invention, all the data acquisition is realized by the same acquisition device, owing to the UHF PD detection signals incoming to signal bus and the simultaneous multi-monitoring ability of the data acquisition device. This realized multiple power equipment on-line detection by low cost which can discover the insulation defect in time and improve operation safety.

BRIEF DESCRIPTION OF THE DRAWINGS

Other features, objects, and advantages of the present invention will become more apparent through reading the detailed description of non-limiting embodiments with reference to the following drawings.

DETAILED DESCRIPTION OF THE PREFERRED EMBODIMENT

The present invention will be specified by the preferred embodiments below. The following preferred embodiment will help technical personnel in the field to further understand of the present invention, but not in any way limit the present invention. It should be noted that, on the premise of not out of the present invention idea, people of ordinary skill in the art can also make a number of transformations and improvements. These all belong to the scope of protection of invention.

Preferred Embodiment 1

Figure 1:
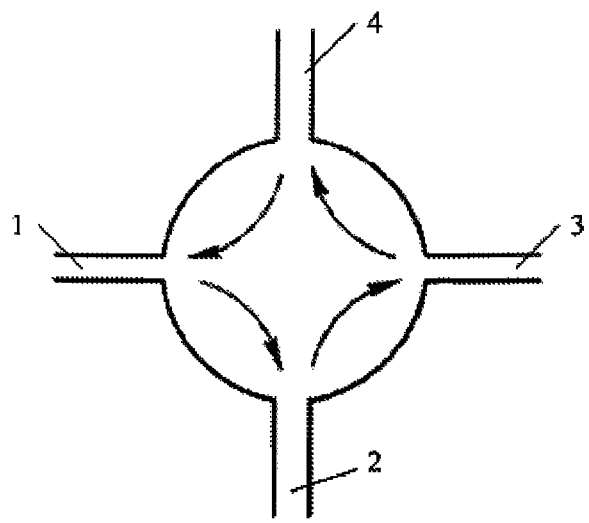
FIG. 1 is a schematic of circulator signal transmission in existing technology.
Figure 2:
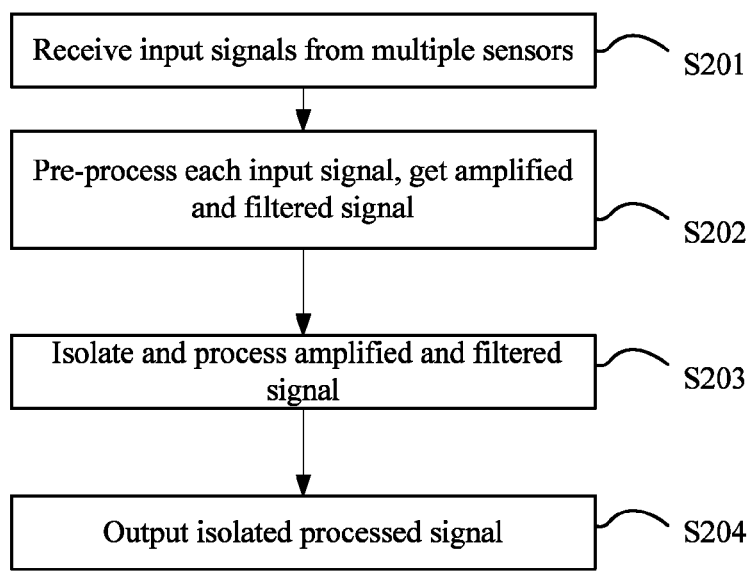
FIG. 2 is a flow chart of a parallel connection method for multi-channel partial discharge signals provided by the embodiment of the present invention.

FIG. 2 is a flow diagram of one embodiment to realize a parallel connection method for multi-channel PD signals.

Figure 3:
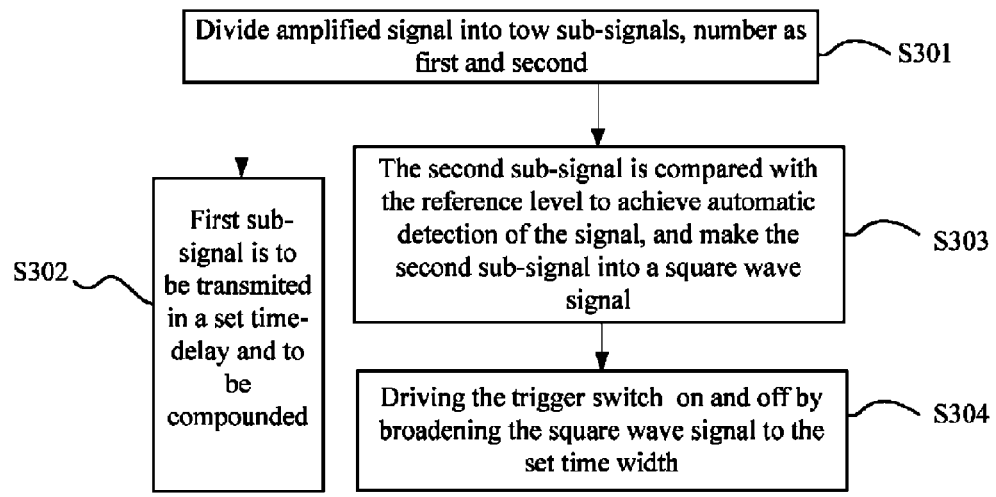
FIG. 3 is a flow chart of isolation process of amplified signal provided by the embodiment of the present invention.

As shown in FIG. 2, the method comprises the following steps:

Step S201: receiving input signals from multiple sensors;

wherein the sensors include UHF PD sensors, ultrasonic sensors and high frequency current sensors. Generate UHF signal, ultrasonic signal and high frequency current signal respectively. So in step S201, it may receive input UHF signals from multiple UHF sensors, or receive input ultrasonic signals from multiple ultrasonic sensors, or receive input high frequency current signals from multiple high frequency current sensors;

Step S202: pre-processing each input signal, getting amplified and filtered signal, wherein for an UHF PD signal, frequency reduction processing is also need; and Step S203: isolating and processing the amplified and filtered signal;

Furthermore, in order to avoid interference among multiple signals in the process of signal transmission and enable the signal to be self-triggered and unidirectional transmitted, the amplified and filtered signals are isolated and processed. The specific isolation process is shown in FIG. 3, which affords a flow chart of isolation process for amplified signal. The isolation process includes steps of:

Step S301: dividing the amplified signal into two sub-signals, numbered as first and second;

Step S302: if the first sub-signal is an UHF PD signal, delay-transmitting the first sub-signal; wherein in delay transmission, the first sub-signal is broken down into multiple spectrum signal groups; delaying each group and then compounding; finally, amplifying the combined signal and outputting through the self-triggering switch. Demodulation can be applied to process the output signal;

wherein specifically, UHF PD signal delay transmission is realized by SAW; frequency bands thereof comprises 400 MHz-500 MHz, 700 MHz-800 MHz, and 1100 MHz-1200 MHz; a surface acoustic wave delay line owns frequency selective characteristics, so as to complete signal filtering; a delay time is equal to or greater than a sum of a trigger switch control circuit and a action time of the switch;

Step S303: comparing the second sub-signal with the reference level to achieve automatic detection of the signal, and transforming the second sub-signal into a driving signal for switch, for example, the driving signal may be a square wave.

wherein specifically, the reference level is a well-set adjustable vale, which is able to be reset according to particular circumstances, the second sub-signal is compared with the reference level to achieve automatic detection of the signal, and transforms the second sub-signal into a driving signal with a constant voltage and a same pulse width with a received signal.

Step S304: driving the trigger switch on and off by broadening the square wave signal to the set time width; and Step S204: outputting the isolated and processed signal of each channel.

The delay time ensures UHF PD signal arrives after the second sub-signal has started the trigger switch. So it can realize parallel connection for multiple channel UHF PD signals without interference and transmission loss.

According to the above technical proposal, the parallel connection method receive input signals from multiple sensors, amplify the signals and isolation process the amplified signals to make them can be self-triggered and unidirectional transmitted. Finally, output those signals. Compared with the prior art, the method connects multiple channel signals without interference and also avoids the transmission loss.

Meanwhile, all the parallel connect PD signals will transmit into one signal bus. So it needs only one acquisition unit to monitor multiple power equipment simultaneously. The method owns advantage of low system cost. It can find insulation defect timely and achieve the purpose of the safe operation of the power equipment.

Preferred Embodiment 2

Figure 4:
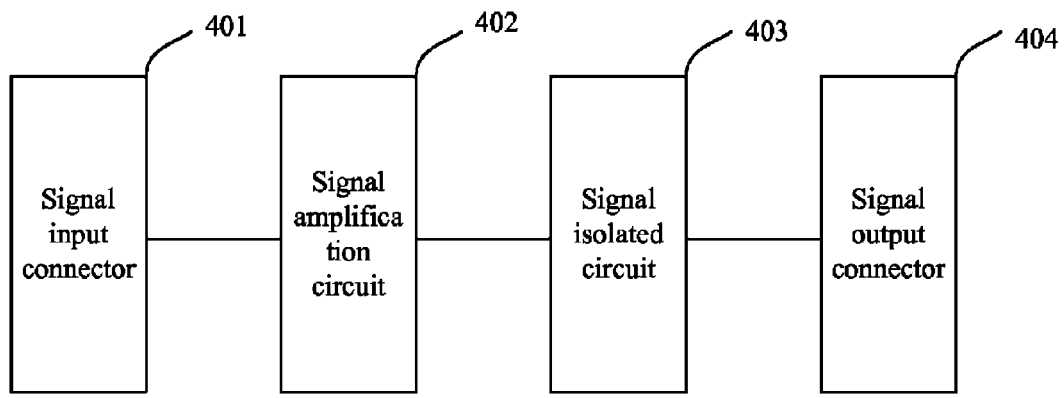
FIG. 4 is a schematic of a parallel connection device for multi-channel partial discharge signals provided by the embodiment of the present invention.

On the basis of the preferred embodiment 1, the present invention also affords a parallel connection device for multi-channel partial discharge signals. FIG. 4 is a schematic of a parallel connection device for multi-channel partial discharge signals provided by the embodiment of the present invention.

The parallel connection device for multi-channel PD signals comprises:

a signal input connector (401), which receives input signals from multiple sensors;

wherein the sensors include UHF PD sensors, ultrasonic sensors and high frequency current sensors, which are used to receive UHF signals, ultrasonic signals and high frequency current signals respectively; the signal input connectors (401) are used to receive input UHF signals from multiple UHF sensors, or receive input ultrasonic signals from multiple ultrasonic sensors, or receive input high frequency current signals from multiple high frequency current sensors;

wherein preferably, the signal input connector (401) chooses a UHF signal connector whose response frequency is 300 MHz-1.5 GHz.

a signal amplification circuit (402), which pre-processes each of the input signals, getting amplified and filtered signal; wherein preferably, the signal amplification circuit chooses a low noise amplifier whose response frequency is 300 MHz-3 GHz, and a amplifier gain is equal or greater than 20 db; and a signal isolation circuit (403), which isolates and processes the amplified and filtered signal, for ensuring self-triggering and unidirectional transmitting; demodulation is able to be applied to the UHF PD signal when going through a self-triggering switch.

Figure 5:
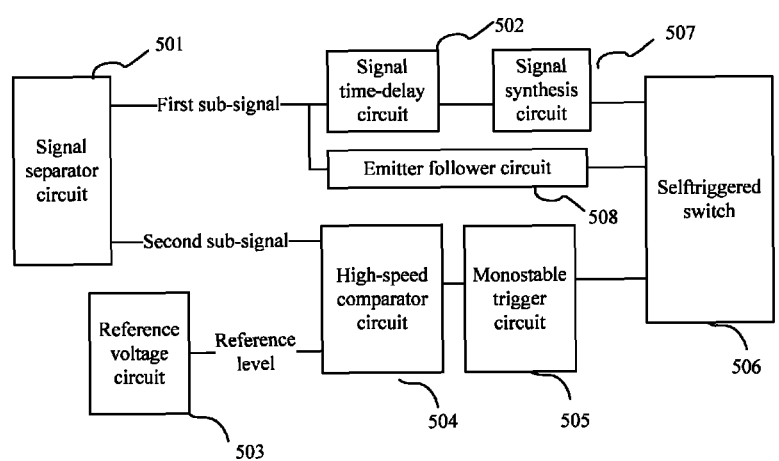
FIG. 5 is a schematic of signal isolated circuit provided by the embodiment of the present invention.

In order to avoid mutual interferences between multiple signals during transmission, the filtered and amplified signals needs isolation processing through the signal isolation circuit (403). FIG. 5 is a schematic of signal isolated circuit provided by the embodiment of the present invention. The signal isolated circuit comprises:

a signal separation circuit (501), which divides the amplified and filtered signal into two sub-signals, namely a first sub signal and a second signal.

a time-delay circuit for the UHF PD signal (502); wherein if the first sub signal is the UHF PD signal, a delay time is set for the first sub signal transmission;

an emitter follower circuit (508), which delays the first sub-signal and then outputs the first sub-signal, on the condition of the UHF PD signal, wherein when the first sub-signal is the high frequency current signal or the ultrasonic signal, the circuit is needless, namely the first sub-signal is outputted through the self-triggering switch directly;

wherein specifically, the time-delay circuit for the UHF PD signal (502) is realized by SAW, frequency bands thereof comprises 400 MHz-500 MHz, 700 MHz-800 MHz, and 1100 MHz-1200 MHz; a surface acoustic wave delay line owns frequency selective characteristics, so as to complete the signal filtering, a delay time is equal to or greater than a sum of the trigger switch control circuit and a action time of the switch;

a signal combination circuit, which combines and amplifies the multiple divided first sub signal to output by the self-triggering switch, wherein preferably, the output signal needs demodulation;

a reference level circuit (503), which offers a reference level;

wherein specifically, the reference level is a well-set adjustable vale afforded by the reference level circuit, which is able to be reset according to the particular circumstances;

a fast-comparison circuit (504), which compares the second sub-signal with the reference level afforded by the fast-comparison circuit (504) for signal auto-detection; the second sub-signal is transferred into a driving signal for switch, such as square signal;

wherein specifically, the second sub-signal is compared with the reference level to achieve automatic detection of the signal, and the second sub-signal is transferred into a driving signal with a constant voltage and a same pulse width with a received signal;

a mono-stable trigger circuit (505), which widens the signal to match a set time width for driving the self-triggering switch (506);

wherein specifically, the mono-stable trigger is made of a 555 timers whose temporary stabilization time is less than 1 microsecond, an action time of the self-triggering switch (506) is less than 10 ns; and a signal output interface (404), which outputs the isolated and processed signal of each channel.

Preferably, the signal output interface (404) chooses an UHF signal interface with a response frequency form 300 MHz to 1.5 GHz.

The delay time ensures the UHF PD signal arrives after the second sub-signal has started the trigger switch, so as to realize parallel connection for multiple channel UHF PD signals without interference and transmission loss.

According to the above technical proposal, the parallel connection method receives input signals from multiple sensors, amplifies the signals and isolates the amplified signals to enable the signals to be self-triggered and unidirectional transmitted. Finally, the signals are outputted. Compared with the prior art, the method connects multiple channel signals without interference and also avoids the transmission loss.

Meanwhile, all the parallel connect PD signals will transmit into one signal bus. So it needs only one acquisition unit to monitor multiple power equipment simultaneously. The method owns advantage of low system cost. It can find insulation defect timely and achieve the purpose of the safe operation of the power equipment.

The specific implementations above are detailed descriptions of the present invention. Need to understand is that the present invention is not limited to the specific implementations above, the skilled person can make various transformations or modification within the scope of the claims, this does not affect the substance of the present invention.

What is claimed is:

1. A parallel connection method for multi-channel PD signals comprising steps of:
    Step1.1: receiving input signals sensed from multiple sensors, wherein the input signals include UHF (ultra-high frequency) PD (partial discharge) signals, ultrasonic signals, and high frequency current signals;
    Step1.2: pre-processing each of the input signals, including amplifying and filtering;
    Step1.3: isolating and processing the amplified and filtered signal through a self-triggering switch, for ensuring self-triggering and unidirectional transmitting of the amplified and filtered signal; and Step1.4: outputting the processed signal of each channel;

wherein isolating and processing comprise steps of:

Step1.3.1: dividing the amplified and filtered signal into two sub-signals, numbered as first and second;

Step1.3.2A: delay-transmitting an UHF PD signal portion of the first sub-signal; wherein in delay transmission, the UHF PD signal portion of the first sub-signal is broken down into multiple spectrum signal groups; delaying each group and then compounding; finally, amplifying the combined signal and outputting through the self-triggering switch; wherein demodulation is applied to process the output signal;

delaying a high frequency current signal portion and an ultrasonic signal portion of the first sub-signal through an emitter follower circuit and outputting the high frequency current signal portion and the ultrasonic signal portion of the first sub-signal through the self-triggering switch;

Step1.3.2B: comparing the second sub-signal with reference level to realize signal auto-detection; if meeting a requirement of the reference level, transferring the second sub-signal into a driving signal for switch; and Step1.3.3: processing the driving signal, for controlling the self-triggering switch;

wherein in delay transmission strategies, an SAW (surface acoustic wave) delay line method is for the UHF PD signal;

wherein the SAW delay line strategy for UHF PD signal delay transmission has frequency bands comprising 400 MHz-500 MHz, 700 MHz-800 MHz, 1100 MHz-1200 MHz.

2. A parallel connection method for multi-channel PD signals comprising steps of:

Step1.1: receiving input signals sensed from multiple sensors, wherein the input signals include UHF (ultra-high frequency) PD (partial discharge) signals, ultrasonic signals, and high frequency current signals;

Step1.2: pre-processing each of the input signals, including amplifying and filtering;

Step1.3: isolating and processing the amplified and filtered signal through a self-triggering switch, for ensuring self-triggering and unidirectional transmitting of the amplified and filtered signal; and Step1.4: outputting the processed signal of each channel;

wherein isolating and processing comprise steps of:

Step1.3.1: dividing the amplified and filtered signal into two sub-signals, numbered as first and second;

Step1.3.2A: delay-transmitting an UHF PD signal portion of the first sub-signal; wherein in delay transmission, the UHF PD signal portion of the first sub-signal is broken down into multiple spectrum signal groups; delaying each group and then compounding; finally, amplifying the combined signal and outputting through the self-triggering switch; wherein demodulation is applied to process the output signal;

delaying a high frequency current signal portion and an ultrasonic signal portion of the first sub-signal through an emitter follower circuit and outputting the high frequency current signal portion and the ultrasonic signal portion of the first sub-signal through the self-triggering switch;

Step1.3.2B: comparing the second sub-signal with reference level to realize signal auto-detection; if meeting a requirement of the reference level, transferring the second sub-signal into a driving signal for switch; and Step1.3.3: processing the driving signal, for controlling the self-triggering switch;

wherein the driving signal for the self-triggering switch is a constant voltage square signal and a pulse width thereof is same with a received signal.

3. A parallel connection device for multi-channel PD signals comprising:

a signal input connector, which receives input signals from multiple sensors, wherein the input signals include UHF PD signals, ultrasonic signals and high frequency current signals;

a signal amplification circuit, which pre-processes each of the input signals, including amplification and filtering;

a signal isolation circuit, which isolates and processes the amplified and filtered signal, for ensuring self-triggering and unidirectional transmitting of the amplified and filtered signal; and a signal output connector, which outputs the isolated processed signal;

wherein the signal isolation circuit comprises:

a signal separation circuit, which divides the amplified and filtered signal into two sub-signals, numbered as first and second;

a time-delay circuit for the UHF PD signal, wherein when the first sub-signal is the UHF PD signal, the first sub-signal is transmitted in a set time-delay;

an emitter follower circuit, wherein when the first sub-signal is the high frequency current signal or the ultrasonic signal, the first sub-signal is delayed by the emitter follower circuit and then outputted through a self-triggering switch;

a signal compound circuit, which breaks down the delayed UHF PD signal into multiple spectrum signal groups; each group is delayed and then compounded, the compounded signal is outputted to the self-triggering switch;

a reference voltage generation circuit, which provides a reference level;

a fast-comparing circuit, which compares the second sub-signal with the reference level to realize signal auto-detection; wherein if meeting a requirement of the reference level, the second sub-signal is transferred into a driving signal for switch; and a mono-stable flip-flop circuit, which processes the driving signal for controlling the self-triggering switch.

4. The device of claim 3, wherein the time-delay circuit for the UHF PD signal has an SAW delay line strategy.

5. The device of claim 3, wherein the SAW delay line strategy has frequency bands comprising 400 MHz-500 MHz, 700 MHz-800 MHz, 1100 MHz-1200 MHz.

6. The device of claim 3, wherein the reference voltage generation circuit is adjustable.

7. The device of claim 3, wherein the driving signal for the self-triggering switch is a constant voltage square signal and a pulse width thereof is same with a received signal.

\* \* \* \* \*